United States Patent [19]
Tao

[11] Patent Number: 5,220,688
[45] Date of Patent: Jun. 15, 1993

[54] FREQUENCY TRANSLATING CIRCUIT WITH MULTIPLE STAGES USING COMMON LOCAL OSCILLATOR

[75] Inventor: Kuang-Chung Tao, Hsinchu, Taiwan

[73] Assignee: Industrial Technology Research Institute, Hsinchu, Taiwan

[21] Appl. No.: 732,176

[22] Filed: Jul. 18, 1991

[51] Int. Cl.$^5$ ............................ H04B 1/26; G06G 7/00
[52] U.S. Cl. ...................................... 455/314; 455/323; 307/529; 333/218
[58] Field of Search ............... 455/314, 316, 323, 325, 455/326, 330, 333, 339; 307/529, 572; 333/218

[56] References Cited

U.S. PATENT DOCUMENTS

| | | | |
|---|---|---|---|
| 3,372,339 | 3/1968 | Harrison et al. | 455/314 |
| 4,580,289 | 4/1986 | Enderby | 455/314 |
| 4,603,436 | 7/1986 | Butler | 455/326 |
| 4,817,197 | 3/1989 | Shimizu et al. | 455/314 |
| 4,845,389 | 7/1989 | Pyndiah et al. | 307/529 |
| 5,108,334 | 4/1992 | Eschenbach et al. | 455/314 |

OTHER PUBLICATIONS

"Microwave Mixers", Stephen Maas, Artech House, 1985, pp. 1-7.

*Primary Examiner*—Reinhard J. Eisenzopf
*Assistant Examiner*—Lisa Charouel
*Attorney, Agent, or Firm*—George O. Saile

[57] ABSTRACT

A multi-stage mixer circuit has a chain of mixer stages that each have a non-linear mixer element that receives a signal to be translated and a local oscillator signal. Each stage also has a filter that passes certain frequency components of the mixer element output to the next mixer stage or to external circuits. All of the mixer stages share a common local oscillator. A selected frequency change can be achieved with a single oscillator and a number of mixer stages. The local oscillator has an advantageously low frequency that is a sub-multiple of the selected frequency change, and the number of mixer stages is equal to this multiple. In one embodiment the oscillator is connected to drive each mixer stage and each filter passes the corresponding difference frequency. In another embodiment, the oscillator is connected to drive only the first mixer element and each filter except the last is arranged to pass to the next mixer stage both the difference frequency and the local oscillator frequency.

6 Claims, 2 Drawing Sheets

FREQUENCY TRANSLATING CIRCUIT WITH MULTIPLE STAGES USING COMMON LOCAL OSCILLATOR

This invention relates to communications apparatus and more specifically to a circuit with multiple frequency translating stages.

INTRODUCTION

When two electrical signals of differing frequencies are applied to a non-linear circuit element, the signals interact in a way that produces two new signals: the sum and the difference of the original frequencies. In effect, the non-linear element multiplies the two sinusoidal functions. (By contrast, when two signals of differing frequencies are applied to a linear circuit element, the signals combine without creating new frequencies.) This process is called "mixing" and a circuit having a non-linear element for this function is called a mixer. The non-linear circuit element can also be called a mixer but in this specification it will ordinarily be called the mixer element.

One of the two frequencies is an input signal, commonly called RF (without regard to the actual frequency range.) The other signal is provided by an oscillator that is part of the translating circuit and is called the local oscillator signal (LO). Ordinarily the purpose of a mixer is to convert the RF signal to the difference frequency. The mixer also has a frequency discriminating filter that passes the difference frequency and rejects the other frequencies. The difference frequency signal at the output of the translator is called the intermediate frequency signal (IF) because it ordinarily contains other frequencies that are processed by other circuits.

A mixer is used wherever it is advantageous to translate a signal at one frequency to a signal at a different frequency. A familiar example is a superhet receiver. It receives a radio frequency signal, for example in a wide range representing television channels, and it mixes this signal with the local oscillator signal. The subsequent stages of the receiver operate at the intermediate frequency, and the local oscillator frequency can be varied for converting a selected RF signal to the intermediate frequency.

Note that the intermediate frequency can be made lower by increasing the local oscillator frequency. However, in some situations, it is undesirable to increase the local oscillator frequency. Some mixers have two stages, and this technique is sometimes called dual-conversion. A general object of this invention is to provide an improved mixer having multiple stages.

THE PRIOR ART

This introductory description of mixers is based on Maas, Microwave Mixers, Artech House, 1985, pages 1-7. Maas page 3 has a diagram of a communication receiver with dual-conversion.

A prior art mixer circuit is shown in the drawing and will be described later as an introduction to some of the components of the mixer circuit of this invention.

Maas Chapter 9, pages 281-318, describes FET mixer elements. The preferred embodiment of the mixer circuit of this invention uses an FET mixer element.

U.S. Pat. No. 4,845,389 shows a gallium arsenide FET mixer element of the general type that is used in the preferred embodiment of the invention.

SUMMARY OF THE INVENTION

One object of this invention is to provide an improved multi-stage mixer circuit. The mixer circuit has a chain of two or more non-linear elements but only one local oscillator. the local oscillator is provided with sufficient power to supply a signal to the mixer elements of each mixer stage.

In one embodiment, the local oscillator is connected to one input of each of the mixer stages. In a second embodiment, the local oscillator is connected to an input of the first mixer stage and the filter of this mixer stage rejects the RF frequency and the sum frequency but passes both the difference frequency and the local oscillator frequency. The local oscillator signal and the difference frequency signal are applied to the next mixer stage in the chain, and this next mixer stage forms their sum and difference. The filter for the output of this last mixer stage removes the local oscillator frequency and the sum frequency and passes only the difference frequency as the intermediate frequency.

Another object of the invention is to provide a new and improved circuit that can use a gallium arsenide FET circuit as the non-linear element Other objects and features of the invention will appear in the description of a preferred embodiment of the invention.

THE DRAWING

Figure 2A:
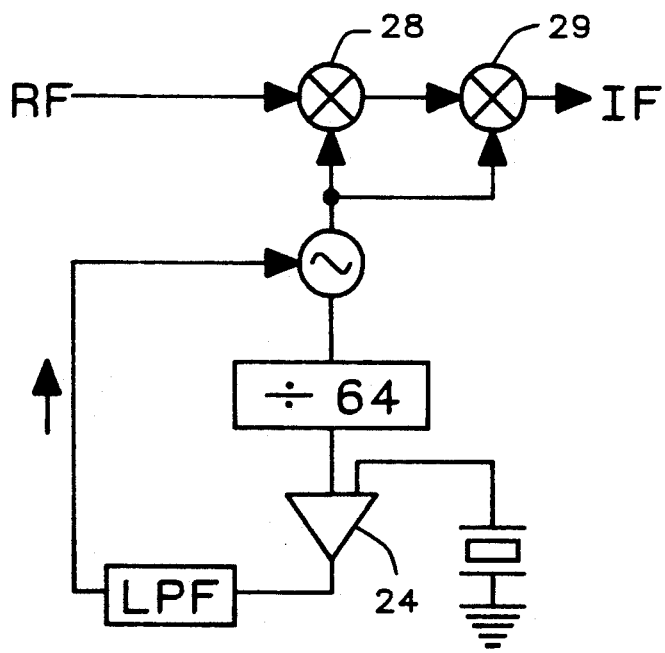
FIG. 2A is a diagram of a dual-stage embodiment of the mixer of this invention with a single local oscillator connected directly to each mixer element.
Figure 2B:
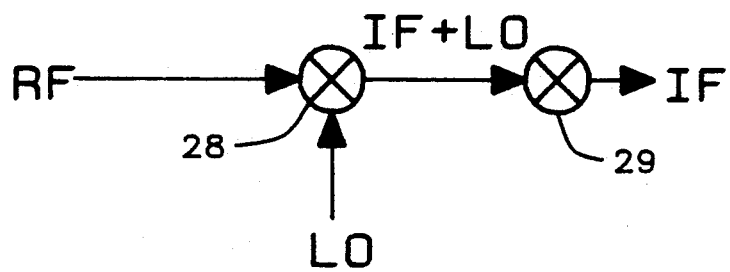

FIG. 2B repeats part of the two stage mixer of FIG. 2A and shows the single local oscillator connected only to the first mixer stage.

Figure 3:
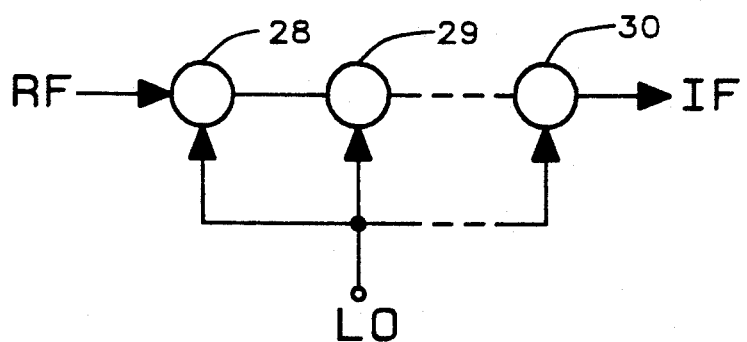

FIG. 3 is a diagram of the mixer showing the general case in which a plurality of mixer stages are connected in a chain and receive a LO signal from a common local oscillator.

Figure 4:
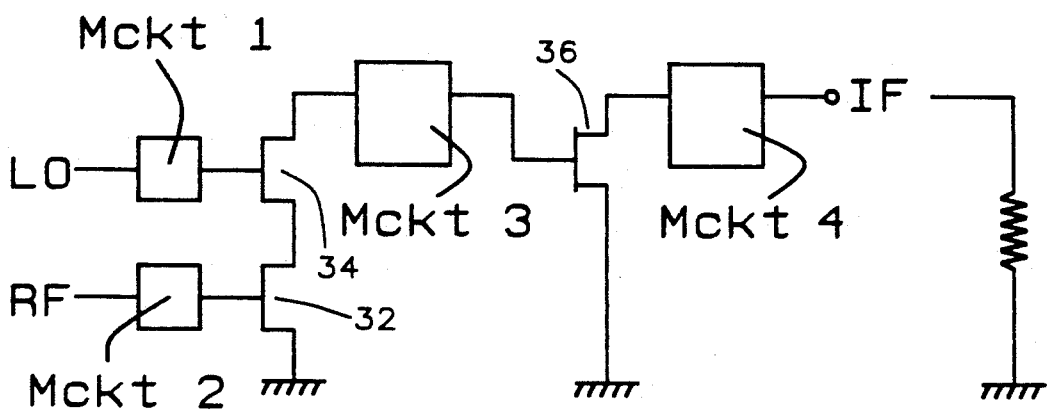

FIG. 4 is a circuit of a preferred embodiment of the mixer circuit.

Figure 5:
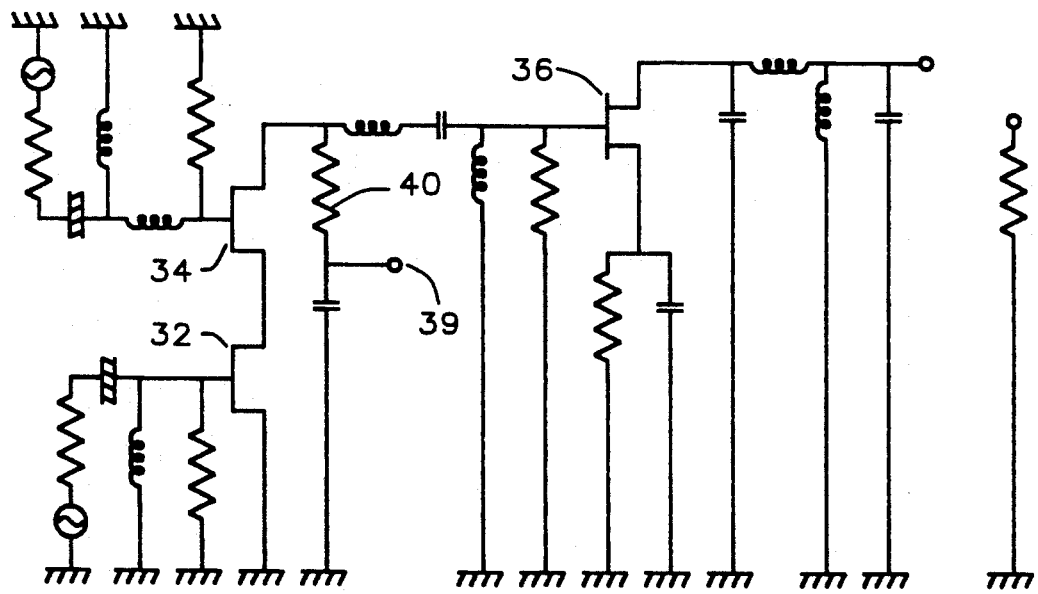

FIG. 5 is similar to FIG. 4 but matching networks that are shown as functions blocks in FIG. 4 are shown fully in FIG. 5.

THE PREFERRED EMBODIMENT

INTRODUCTION—FIG. 1

A summary description of this known frequency translating circuit will provide a helpful review of these circuits and a summary of the terminology that will be used in describing the preferred embodiment of this invention. Equivalent circuits and equivalent components are well known.

Figure 1:
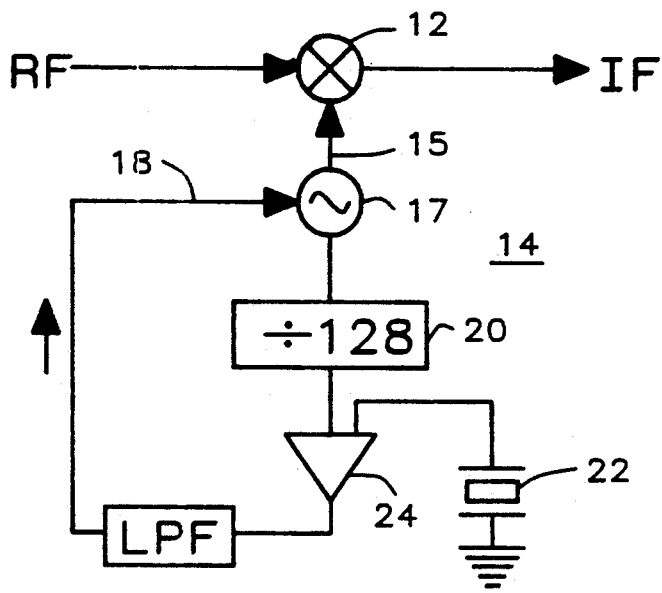
FIG. 1 is a diagram of a prior art mixer showing some of the components that are used in the multi-stage mixer of this invention.

The mixer circuit of FIG. 1 has a mixer element 12 and a local oscillator 14. The mixer element receives the signal RF at one input port and it receives the local oscillator signal LO at another input port 15. It produces the intermediate frequency signal IF at its output. (The filter that passes the intermediate frequency and blocks the other frequencies is not shown.)

A voltage controlled oscillator 17 produces the local oscillator signal LO. The frequency of a voltage controlled oscillator is variable within a predetermined range in response to a controlling signal, which is shown as an input 18.

The local oscillator signal is also supplied to a frequency divider circuit 20 that forms part of the frequency control circuit for the oscillator. The frequency control circuit produces the voltage variable signal input to the oscillator that controls its frequency.

Commonly a frequency divider is a counter that is cycled through a predetermined counting sequence. The output is typically formed by the high order bit position, which has an up level through one half of the counting sequence and a down level through the other half. The divider value of 128 is arbitrary but it provides a specific will be used later in comparing the invention with this prior art.

A crystal 22 establishes the selected frequency. The output of the frequency divider and the crystal voltage have approximately the same frequency. Since the oscillator is controlled to maintain the output of the divider circuit closely equal to the frequency of the crystal, the local oscillator signal at the input of the divider (and at the input to the mixer element) is closely equal to 128 times the frequency of the crystal.

A comparator 24 receives the output of the divider and the voltage of the crystal and produces a difference signal at its output. The comparator output is applied through a loop filter LPF to the voltage controlled oscillator to correct the LO frequency to equal a multiple of the crystal frequency.

The mixer of FIG. 2A and 2B

To simplify the comparison of this circuit with FIG. 1, RF and IF are given the same frequency as these signals in FIG. 1 and the crystal has the same frequency as in FIG. 1. However, it is an object of this invention to use a lower local oscillator frequency and the local oscillator has a frequency that is only half the value of the local oscillator of FIG. 1, as indicated by the count valve 64 in the block diagram for the frequency divider. (The 2 to 1 ratio of the counters corresponds to the fact that there are twice as many mixer stages in FIGS. 2A and 2B.) The other components will be familiar from FIG. 1.

The circuits of FIGS. 2A and 2B have two mixer elements 28 and 29 which will be called first and second in the direction in which the signals propagate. A preferred mixer element is described later, but suitable mixer elements are well known. It is a feature of this invention that the same local oscillator is arranged to provide the local oscillator input to both mixer elements, and local oscillator is provided with sufficient power to supply signals to both mixer elements.

In the circuit of FIG. 2A, the local oscillator signal is applied directly to the inputs of each mixer element. A filter, not shown, at the output of each mixer element removes all frequencies except the difference frequency. The output of the second mixer element 29 is the signal IF, which is the same as the signal IF in FIG. 1.

In the circuit of FIG. 2B, the local oscillator signal is applied to the input of only the first mixer element 28. A filter at the output of the first mixer element removes the RF frequency and the sum frequency and passes the difference frequency (as in FIG. 2A) but it also passes the local oscillator frequency, as the legend IF+LO represents. The second mixer element mixes the frequencies IF and LO and a filter at the output passes the difference frequency and rejects the other frequencies.

Note that the local oscillator frequency is the same in each stage but the difference frequency is decreased by the value of the local oscillator frequency at each stage.

FIG. 3 shows the general case in which the mixer circuit has one local oscillator driving a selected number (greater than 1) of mixer elements. FIG. 3 shows a direct connection from the local oscillator to each mixer, as in FIG. 2A. The filter (not shown) at the output of each mixer element transmits only the difference frequency to the next mixer element or to the circuits that receive the final intermediate frequency, IF.

In the general case for the interconnection of FIG. 2B, only the first mixer element 28 of the chain is connected to the local oscillator the local oscillator frequency is transmitted through each stage of the chain. The filter for the last stage 30 passes only the final intermediate frequency, IF, and the other filters pass both the local oscillator frequency and the difference frequency from the preceding stage.

The embodiment of FIG. 2A will usually be preferred where the number of mixer stages is small. The embodiment of FIG. 2B will usually be preferred for a larger number of mixer stages because it simplifies supplying the local oscillator signal to the mixer stages.

The circuit of FIGS. 4 and 5

This circuit forms the two mixer stages of FIG. 2B, in which the first stage produces the combination of the local oscillator signal and the difference frequency and subsequent stages mix the local oscillator signal and the difference frequency to produce a lower difference frequency IF.

FIG. 4 shows the two mixer stages formed by three gallium arsenide FETs 32, 34 and 36. Two FETs 32 and 34 are connected to conduct in series and form a nonlinear element. The circuit configuration of FETs 32 and 34 is sometimes called a dual gate mixer. A matching network Mckt 1 couples FET 34 to receive the local oscillator signal LO and a matching network Mckt 2 couples FET 32 to receive the input signal RF. Circuits Mckt 1 and Mckt 2 match the impedances of the circuits at their inputs and outputs, and matching circuits for this function are well known. The output of the dual gate mixer circuit (at the input to matching network Mckt 3) contains signal RF, LO and their sum and difference (the usual output of a mixer). Matching network Mckt 3 rejects all signals except LO and the difference frequency at the dual gate mixer output and passes these signals to the mixer circuit of FET 36.

FET 36 is connected to form a gate mixer circuit. The circuit before gate mixer also functions as a power combiner for the difference frequency and the local oscillator frequency, and the gate mixer produces these signals and their sum and difference at its output. A matching network Mckt 4 receives the output of the gate mixer and passes the appropriate frequencies to the next stage of the chain or to the circuits that use the signal IF. A load resistor in FIG. 4 represents the circuit that receives the output of circuit Mckt 4.

When the gate mixer circuit of FIG. 4 is connected to another gate mixer circuit, circuit Mckt 4 passes both the local oscillator signal and the new difference frequency. The mixer circuit Mckt 4 for the last mixer stage preferably passes only the difference frequency to the circuits that use the translated frequency.

FIG. 5 shows further details of the circuit of FIG. 4 and it will be understood readily from a few comments.

The signals LO and RF are represented by the symbol for a signal generator. The terminal 39 at the junction of a capacitor and the load resistor 40 of the non-linear element is the power supply connection and the capacitor conventionally stabilizes this voltage. An inductor can be substituted for resistor 40 if the difference frequency is close to the LO frequency and better frequency discrimination is needed.

Subsequent stages in the mixer of FIG. 2B use only the gate mixer circuit of FET 36. Each stage of the multi-stage mixer of FIG. 2A or FIG. 3 has the dual gate mixer of FETs 32 and 34; the filter passes only the difference frequency, as already explained (instead of the difference frequency and the local oscillator frequency as explained for filter circuit Mckt 3).

Other Embodiments

Those skilled in the art will recognize various applications for the multi-stage mixer of this invention and modifications of the preferred embodiment, within the spirit of the invention and the intended scope of the claims.

I claim:

1. A multi-stage frequency translator for receiving an input signal (RF) of a first frequency at a first stage and producing an output signal (IF) of a lower frequency at a last stage, wherein the improvement comprises:
   a local oscillator,
   in each stage except the last, a mixer element and a filter means,
   the first stage mixer element (28) being connected directly to receive the input signal and connected to the local oscillator to receive a local oscillator signal (LO) from the local oscillator,
   the filter means in the first stage and in each other stage except the last stage connecting the mixer element of the associated stage to supply to the mixer element (29) of a next stage a signal that contains a difference frequency and the local oscillator signal,
   a last stage mixer element (29) connected to receive an output signal of a preceding stage (28) to form a chain of two or more mixer stages,
   and filter means (Mckt 4) in the last stage connecting the mixer element of the last stage to form the frequency translator output signal containing the difference frequency of the last stage mixer element but not the local oscillator signal,
   whereby the local oscillator signal is propagated from the first stage to each subsequent stage and each stage except the first mixes the difference frequency from the preceding stage and the local oscillator signal from the preceding stage.

2. The frequency translator of claim 1, wherein the chain of mixer stages has two mixer stages and the last mixer stage is connected to receive an output of the first mixer stage.

3. The frequency translator of claim 1, wherein the first stage mixer element comprises a dual gate mixer circuit (32, 34) and each subsequent mixer element comprises a gate mixer circuit (36).

4. The frequency translator of claim 3, wherein the dual gate mixer circuit comprises a first FET (32) and a first matching circuit (Mckt 2) coupling the first FET to receive the input signal (RF) and a second FET (34) and a second matching circuit (Mckt 1) coupling the second FET to receive the local oscillator signal and wherein the filter means, in each stage except the last, comprises a third matching circuit (Mckt 3) passing the difference frequency and the local oscillator signal.

5. The frequency translator of claim 4, wherein the gate mixer circuit comprises a third FET (36).

6. The frequency transistor of claim 4, wherein the FETs (32, 34, 36) are gallium arsenide FETs.

* * * * *